United States Patent
Hass et al.

(10) Patent No.: US 8,124,178 B2
(45) Date of Patent: Feb. 28, 2012

(54) METHOD AND APPARATUS APPLICATION OF METALLIC ALLOY COATINGS

(75) Inventors: Derek D. Hass, Charlottesville, VA (US); Haydn N. G. Wadley, Keswick, VA (US); Kumar P. Dharmasena, Charlottesville, VA (US); Yosef Marciano, Metar, IL (US)

(73) Assignee: University of Virginia Patent Foundation, Charlottesville, VA (US)

(*) Notice: Subject to any disclaimer, the term of this patent is extended or adjusted under 35 U.S.C. 154(b) by 2318 days.

(21) Appl. No.: 10/489,090

(22) PCT Filed: Sep. 10, 2002

(86) PCT No.: PCT/US02/28654
§ 371 (c)(1),
(2), (4) Date: Mar. 9, 2004

(87) PCT Pub. No.: WO03/028428
PCT Pub. Date: Apr. 10, 2003

(65) Prior Publication Data
US 2005/0000444 A1 Jan. 6, 2005

Related U.S. Application Data

(60) Provisional application No. 60/318,286, filed on Sep. 10, 2001.

(51) Int. Cl.
*C23C 16/00* (2006.01)
*H05H 1/24* (2006.01)
*H01T 14/00* (2006.01)
*H05H 1/48* (2006.01)
*C23C 14/30* (2006.01)
*H05B 7/00* (2006.01)

(52) U.S. Cl. ...... 427/248.1; 427/569; 427/250; 427/580; 427/596

(58) Field of Classification Search .......... 427/248.1, 427/569, 250, 580, 596
See application file for complete search history.

(56) References Cited

U.S. PATENT DOCUMENTS
3,620,815 A 11/1971 Blecherman
(Continued)

FOREIGN PATENT DOCUMENTS
DE 38 14 652 A1 11/1988
(Continued)

OTHER PUBLICATIONS
Hass, et al. "Electron beam directed vapor deposition of thermal barrier coatings" J. Vac. Sci. Technol. A 16(6), Nov./Dec. 1998, pp. 3396-3401.*

*Primary Examiner* — Kelly M Gambetta
(74) *Attorney, Agent, or Firm* — Novak Druce DeLuca + Quigg LLP; Robert J. Decker

(57) ABSTRACT

A directed vapor deposition (DVD) method and system for applying at least one bond coating on at least one substrate for thermal barrier coating systems. To overcome the limitations incurred by conventional methods, the DVD system uses an electron beam directed vapor deposition (DVD) technique to evaporate and deposit compositionally and morphologically controlled bond coats at high rate. The present DVD system uses the combination of an electron beam and a combined inert gas/reactive gas carrier jet of controlled composition to create engineering films. In this system, the vaporized material can be entrained in the carrier gas jet and deposited onto the substrate at a high rate and with high materials utilization efficiency. The velocity and flux of the gas atoms entering the chamber, the nozzle parameters, and the operating chamber pressure can all be significantly varied, facilitating wide processing condition variation and allowing for improved control over the properties of the deposited layer.

27 Claims, 15 Drawing Sheets

U.S. PATENT DOCUMENTS

| | | | |
|---|---|---|---|
| 5,464,667 A | 11/1995 | Kohler et al. | |
| 5,534,314 A * | 7/1996 | Wadley et al. | 427/585 |
| 5,573,682 A | 11/1996 | Beason, Jr. et al. | |
| 5,736,073 A | 4/1998 | Wadley | |
| 5,846,608 A | 12/1998 | Neumann | |
| 6,096,381 A | 8/2000 | Zheng | |
| 6,123,997 A | 9/2000 | Schaeffer | |
| 6,153,313 A | 11/2000 | Rigney | |
| 6,168,874 B1 | 1/2001 | Gupta | |
| 6,172,331 B1 | 1/2001 | Chen | |
| 6,255,001 B1 * | 7/2001 | Darolia | 428/610 |
| 6,258,467 B1 | 7/2001 | Subramanian | |
| 6,273,678 B1 | 8/2001 | Darolia | |
| 6,291,084 B1 | 9/2001 | Darolia | |
| 6,306,524 B1 | 10/2001 | Spitsberg | |
| 6,478,931 B1 | 11/2002 | Wadley | |

FOREIGN PATENT DOCUMENTS

| | | |
|---|---|---|
| DE | 43 04 613 C1 | 5/1994 |
| DE | 198 41 012 C1 | 1/2000 |
| WO | WO 01/90438 | 11/2001 |
| WO | WO 02/087787 | 11/2002 |

* cited by examiner

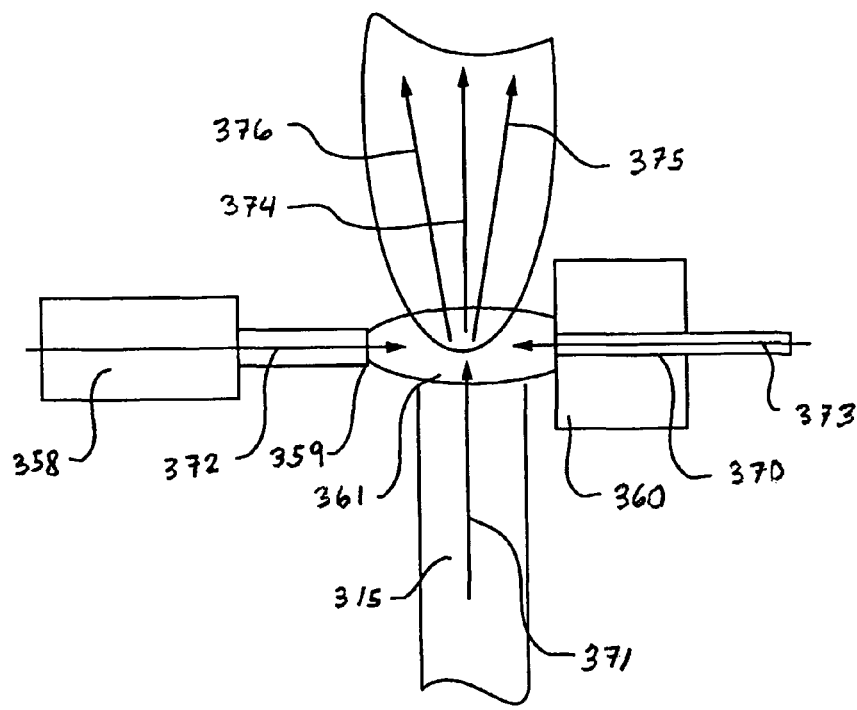
FIG. 12
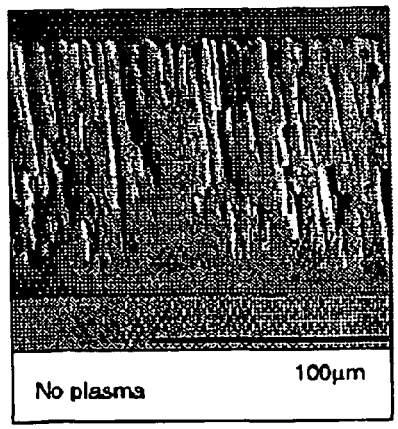
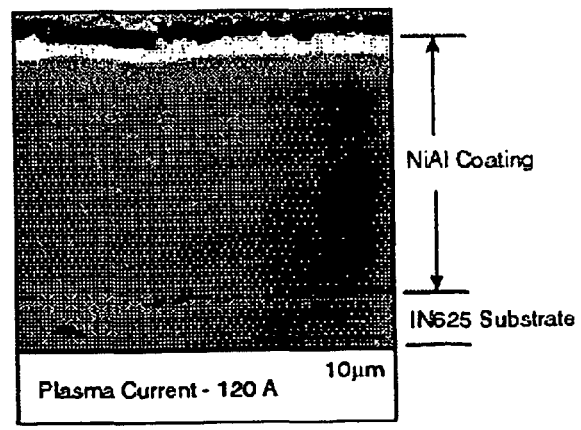
FIG. 13A    FIG. 13B

METHOD AND APPARATUS APPLICATION OF METALLIC ALLOY COATINGS

RELATED APPLICATIONS

This application is a national stage filing of International Application No. PCT/US02/28654, filed on Sep. 10, 2002, which claims benefit under 35 U.S.C. Section 119(e) from U.S. Provisional Application Ser. No. 60/318,286, filed Sep. 10, 2001, entitled "Method and Apparatus for Application of Metallic Alloy Coatings," the entire disclosures of which are hereby incorporated by reference herein.

The present application is also related to International Application No. PCT/US01/16693, filed May 23, 2001 entitled "A process and Apparatus for Plasma Activated Deposition in a Vacuum," and to International Application No. PCT/US02/13639, filed Apr. 30, 2002 entitled "Method and Apparatus for Efficient Application of Substrate Coating," both of which are assigned to the present assignee and are hereby incorporated by reference herein in their entirety.

GOVERNMENT SUPPORT

This invention was made with government support under the Office of Naval Research—DURIP Grant Nos. N00014-97-1-0106 and N00014-00-1-0438. The government has certain rights in the invention.

FIELD OF THE INVENTION

The present invention provides a method and an apparatus for efficiently applying a bond coat to a surface for thermal barrier coating systems using a directed vapor deposition (DVD) approach.

BACKGROUND OF THE INVENTION

Metallic alloy coatings are widely used to create functionality that is not possessed by the underlying material. A good example is the case of thermal barrier coating (TBC) systems which are used for the thermal and oxidation protection of the high temperature components used in advanced gas turbine and diesel engines to increase engine operating temperatures (and therefore improve engine efficiency) and to improve component durability and life. The TBC's currently in use are multi-layer systems consisting of a Zirconia based top layer that thermally protects the superalloy component, and an underlying bond coat which improves the top coat adhesion. The bond coat is typically an aluminum containing alloy such as MCrAlY (M=Ni and/or Co) or an aluminum based inter-metallic such as a nickel or platinum aluminide. This layer is well bonded to a thin (~1 μm) thermally grown (aluminum) oxide (TGO) layer which impedes oxidation and hot corrosion of the underlying component. This TGO layer is formed on the surface of the aluminum-rich alloy bond coat layer. The TBC systems currently in use are multilayer systems consisting of an yttria partially-stabilized zirconia (YSZ) top layer that thermally protects the superalloy component, and an underlying MCrAlY (M=Ni, Co) or nickel aluminide bond coat which improves the YSZ adhesion.

Bond coats have conventionally been applied using a variety of techniques depending on the materials system used. For example MCrAlY bond coats are applied using low pressure plasma spray (LPPS), electron beam physical vapor deposition (EB-PVD) and sputtering. The aluminide bond coats are typically applied using a diffusion based process. Such processes include pack cementation, vapor phase aluminiding (VPA), or chemical vapor deposition (CVD). The diffusion processes result in a bond coat with two distinct zones; an outer zone which contains an oxidation resistant phase (such as beta-NiAl) and a diffusion zone which consists entirely of the oxidation resistant phase and secondary phases (such as gamma prime, gamma, carbides and sigma).

The primary function of the bond coat is to form a thin, slow growing, alpha alumina oxide layer (TGO) which protects the underlying component for oxidation and corrosion. This function is dependent on the composition and morphology of the coating. The composition is critical to the formation of the TGO layer for two reasons. The first is the need to have an aluminum level high enough to support the continued growth of the protective aluminum oxide layer during the lifetime of the coating system. As a TGO grows in service the aluminum content is continually decreased. When the aluminum content falls below a critical level, nonprotective oxides begin to form which lead to spallation of the TGO layer. Thus, a large aluminum reservoir is desired. TGO formation can also be effected by minor alloy additions which may occur as a result of inter-diffusion between and bond coat and the superalloy substrate. Such elements can increase the growth rate of the TGO layer and may promote the formation of unwanted, nonprotective oxide scales. Ideally, inter-diffusion between the bond coat and the superalloy should be limited both during the formation of the bond coat and during service of the component.

The surface morphology of a bond coat can also effect TGO growth. For example, a dense coating free of open porosity is required to form a protective scale on the coating surface. Open porosity results in internal oxidation of the bond coat and oxidation of the underlying component. Another key morphological feature of the bond coat is a grain size. The presence of insoluble particles has been used to create fine grain sizes (x) which are thought to increase the lifetime of TBC systems. Higher static and creep strength bond coats are desired as they limit the thermomechanical phenomena which lead to failure of the TBC system.

The conventional processes currently in use for applying bond coats are limited by several drawbacks. None of the processes adequately control the composition of the bond coat. For the diffusion based processes, inter-diffusion between the bond coat and the substrate and the inability of these approaches to systematically add minor alloying additions to the bond coat are serious impediments. In EB-PVD, poor composition control results when materials with widely varying vapor pressures are deposited. A second drawback of the conventional processes is the high cost of such processes. Sputter deposition suffers from low vapor creation rates. EB-PVD has a very low process efficiency which results in low deposition rates and an uneconomical process. Furthermore, the line-of-sight deposition makes it difficult to coat non planar samples. Plasma spray coatings are often not fully dense and thus the oxidation resistance of such coatings is poor.

There is therefore a need in the art for a low cost deposition approach for applying bond coats which have the desired compositions which are difficult to deposit using conventional approaches. Further, there is a need in the art for a deposition approach for applying bond coats that exhibit condition control, such as morphology composition and grain size of deposited bond coats.

In all such cases, the ability to deposit compositionally controlled coatings efficiently, uniformly, at a high rate, with high part throughput, and in a cost-effective manner is desired. Some illustrative examples of deposition systems are provided in the following applications and patents and are co-assigned to the present assignee 1) U.S. Pat. No. 5,534,314, filed Aug. 31, 1994, entitled "Directed Vapor Deposition of Electron Beam Evaporant," 2) U.S. Pat. No. 5,736,073, filed Jul. 8, 1996, entitled "Production of Nanometer Particles by Directed Vapor Deposition of Electron Beam Evaporant," and 3) U.S. application Ser. No. 09/634,457, filed Aug. 7, 2000, entitled "Apparatus and Method for Intra-layer Modulation of the Material Deposition and Assist Beam and the Multilayer Structure Produced Therefrom". These applications are hereby incorporated by reference herein in their entirety. The present invention discloses, among other things an apparatus and a method for applying a bond coating(s) on a substrate(s) in an improved and more efficient manner.

Other U.S. Patents that are hereby incorporated by reference herein in their entirety include the following:
U.S. Pat. No. 6,096,381, Zheng (2000)
U.S. Pat. No. 6,123,997, Schaeffer et al. (2000)
U.S. Pat. No. 6,153,313, Rigney et al. (2000)
U.S. Pat. No. 6,168,874, Gupta et al. (2001)
U.S. Pat. No. 6,255,001, Darolia (2001)
U.S. Pat. No. 6,258,467, Subramanian (2001)
U.S. Pat. No. 6,273,678, R. Darolia (2001)
U.S. Pat. No. 6,291,084, Darolia et al. (2001)
U.S. Pat. No. 6,306,524, Spitsberg et al. (2001)

SUMMARY OF THE INVENTION

The present invention provides a method and an apparatus for efficiently applying a bond coating to a surface for thermal barrier coating systems using a directed vapor deposition (DVD) approach. To overcome the limitations incurred by conventional methods, the present invention uses an electron beam directed vapor deposition (DVD) technique to evaporate and deposit compositionally and morphologically controlled bond coats at high rate. The present invention DVD technique uses the combination of an electron beam gun (capable of processing material in a low vacuum environment) and a combined inert gas/reactive gas carrier jet of controlled composition to create engineering films. In this system, the vaporized material can be entrained in the carrier gas jet and deposited onto the substrate at a high rate and with a high materials utilization efficiency. The velocity and flux of the gas atoms entering the chamber, the nozzle parameters, and the operating chamber pressure can all be significantly varied, facilitating wide processing condition variation and allowing for improved control over the properties of the deposited layer.

In another aspect of the present invention, by employing plasma enhancement, multisource crucibles and process condition control, the morphology, composition and grain size of deposited layers are controlled. The result is a low cost deposition approach for applying bond coats which often have compositions which are difficult to deposit using other conventional approaches. The DVD apparatus and method comprises a vacuum chamber having a substrate bias system capable of applying a DC or alternating potential to at least one of the substrates. The electron beam impinges at least one of the generated vapor flux and at least one of the carrier gas stream with a working gas generated by at least one hollow cathode arc plasma activation source to ionize at least one of the generated vapor flux and at least one of the carrier gas stream. The ionized generated vapor flux and carrier gas stream are attracted to the substrate surface by allowing a self-bias of the ionized gas and vapor stream or the potential to pull the ionized stream to the substrate.

In other preferred embodiments, the DVD apparatus and method comprises a vacuum chamber having a radio frequency field that is used to ionize the evaporant and/or the carrier gas stream and a self and/or static or radio frequency bias voltage applied to the substrate that is used to provide plasma enhanced deposition of the coating.

In other preferred embodiments, the DVD apparatus and method comprises a technique for creating a plasma consisting of partially or fully ionized evaporant or carrier gas stream that is used in combination with a self or applied DC or RF bias voltage applied to the substrate to provide plasma enhanced deposition of a coating. In second embodiment, the present invention provides a method for applying at least one bond coating on at least one substrate for forming a thermal barrier system. The method includes: presenting at least one substrate; forming a bond coat on at least a portion of at least one substrate by a directed vapor deposition (DVD) technique; and depositing a thermal-insulating layer on the bond coat. In some embodiments the substrate is presented to the substrate in a chamber, wherein the chamber has an operating pressure ranging from about 0.1 to about 32,350 Pa. The method further includes: presenting at least one evaporant source to the chamber; presenting at least one carrier gas stream to the chamber; impinging at least one evaporant source with at least one electron beam in the chamber to generate an evaporated vapor flux in a main direction respective for any of the evaporant sources impinged by the electron beam; and deflecting at least one of the generated evaporated vapor flux by at least one of the carrier gas stream, wherein the carrier gas stream is essentially parallel to the main direction and substantially surrounds the evaporated flux, wherein the evaporated vapor flux at least partially coats at least one substrate to form said bond coat, or any other coating or thin film.

In another aspect of the present invention, the present invention provides a method and apparatus for applying at least one bond coating on at least one substrate for forming a thermal barrier system. The method and apparatus includes: interrupting the progress of producing evaporated flux for forming said bond coat; and providing oxygen in at lest one of said carrier gas streams, thereby resulting in the deposition of alpha alumina on at least one of said substrates. The steps of this method may be repeated as desired.

In yet another aspect of the present invention, the present invention provides a method and apparatus for applying at least one bond coating on at least one substrate for forming a thermal barrier system. The method and apparatus includes: providing nanoclusters under a pressure greater than the chamber pressure; and injection the nano clusters at a high velocity into the chamber, thereby resulting in nanoclusters impinged in the bond coat.

In a third embodiment, the present invention provides an apparatus for applying at least one bond coating on at least one substrate for forming a thermal barrier system. The apparatus includes a chamber, wherein the chamber has an operating pressure ranging from about 0.1 to about 32,350 Pa, wherein at least one of the substrates is presented in the chamber. The apparatus further comprises: at least one evaporant source disposed in the chamber; at least one carrier gas stream provided in the chamber; and an electron beam system providing at least one electron beam. The electron beam impinges at least one evaporant source with at least one electron beam in the chamber to generate an evaporated vapor flux and deflects at least one of generated evaporated vapor flux by at least one of carrier gas stream, wherein the evaporated vapor flux at least partially coats at least one of the substrates to form a bond coat.

In a fourth embodiment, the present invention provides component having a thermal barrier coating system on a substrate thereof, the thermal barrier coating system includes a bond coat deposited on at least a portion of the substrate by a directed vapor deposition (DVD) technique; and a thermal-insulating layer overlying at least a portion of the bond coat. The component may be produced by the present invention methods discussed throughout this document. The advantages of the present invention include, but are not limited to: improved use of expensive gases, increased deposition efficiency, improved uniformity in the coating, a means for coating of multiple components with non-planar geometry such as turbine blades/vanes, a means for efficiently heating the parts during coating, and a means for controlling the composition of the coating. These improvements will allow for high rate deposition of multiple components per run leading to a high component throughput while still using a low cost deposition process and producing coatings with the desired properties.

The result is a dramatically improved method for the efficient application of a bond coating to a surface for thermal barrier systems.

These and other objects, along with advantages and features of the invention enclosed herein, will be made more apparent from the description, drawings, and claims that follow.

DESCRIPTION OF THE FIGURES

The foregoing and other objects, features, and advantages of the present invention, as well as the invention itself, will be more fully understood from the following description of preferred embodiments, when read together with the accompanying drawings, in which:

FIG. 12 shows a schematic representation of an alternative embodiment of the present invention, demonstrating the deflection of the main gas and vapor stream and a compensation of it by of an opposed gas injection from the anode.

FIGS. 13A-13B are SEM micrographic representations showing the morphology of NiAl coatings, wherein FIG. 13A is the outcome of no plasma activation resulting in a columnar morphology and FIG. 13B is the outcome of plasma activation using a plasma current of 120 A and a substrate bias of −75 V resulting in the removal of the columnar pores and the formation of a dense NiAl coating.

DESCRIPTION OF THE PREFERRED EMBODIMENTS

The present invention directed vapor deposition (DVD) apparatus and related method provide the technical basis for a small volume, low cost coating process capable of depositing the bond coat of a thermal barrier coating (TBC) system. DVD technology utilizes a trans-sonic gas stream to direct and transport a thermally evaporated vapor cloud to a component. The footprint of the vapor plume can be varied from a diameter of about 2-3 cm to as much about 20 cm. As a result small airfoils, or portions of large airfoils (that are being repaired) can be coated with very little overspill and thus waste of the vapor cloud. Typical operating pressures are approximately in the 0.05 to 0.5 Torr range requiring the use of inexpensive mechanical pumping. In this new process, material is thermally vaporized using a high voltage/low power (about 60 or 70 kV/10 KW) axial e-beam gun (modified to function in a low vacuum environment). The vapor is then entrained in a carrier gas stream and deposited onto a substrate at high rate (about >10 μm min$^{-1}$ for a plume cross sectional area of about 50 cm$^2$) and with a high materials utilization efficiency greater than ten times that of conventional EB-PVD processes. These characteristics combine to make the present invention DVD process a low cost solution for depositing bond coats onto gas turbine airfoils and other engine components.

Figure 1:
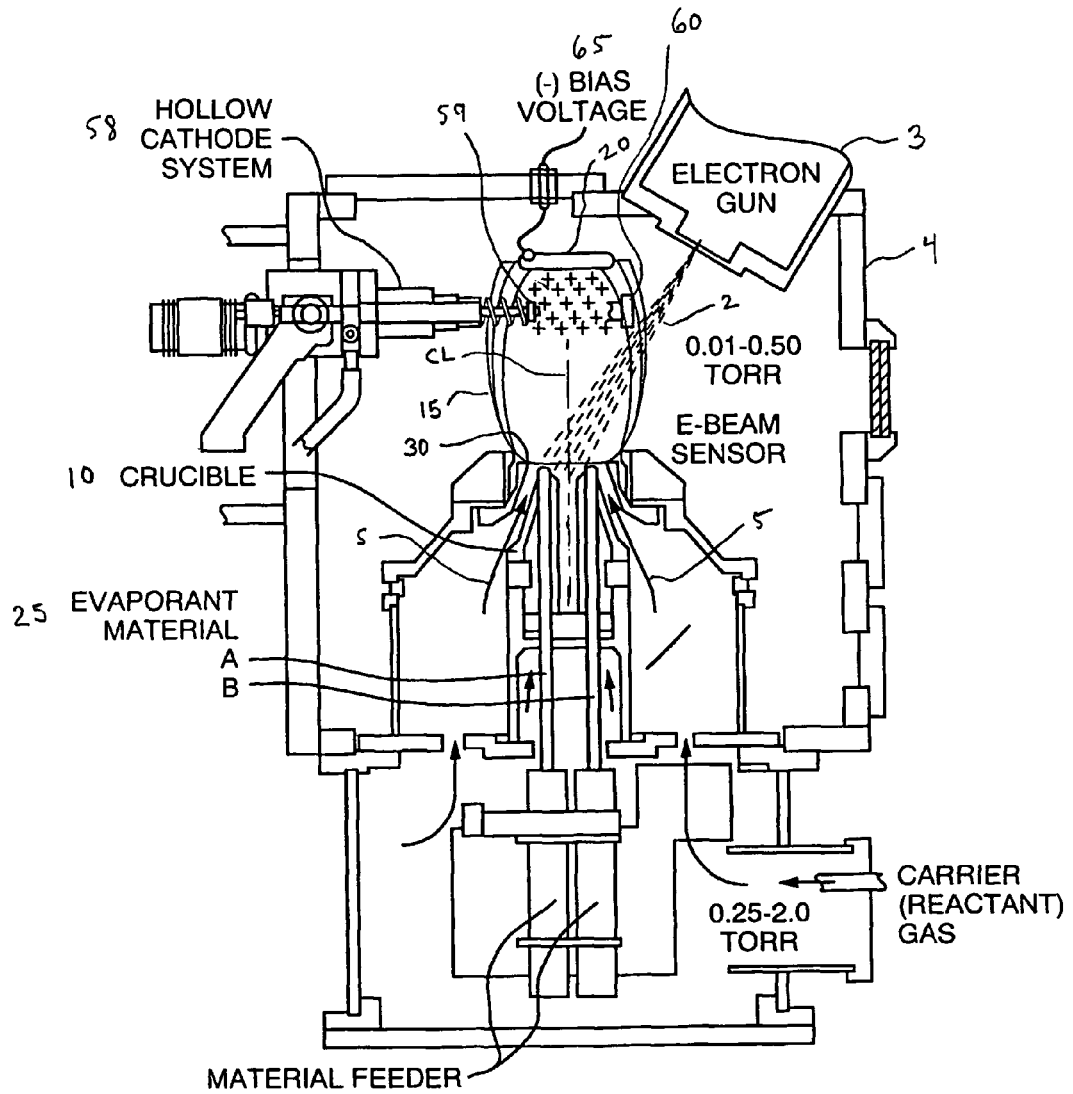
FIG. 1 is a schematic illustration of the directed vapor deposition (DVD) processing system. Included in the process are the ability to evaporate from four or more individual source materials and, optionally, the ability to ionize the evaporated flux using hollow cathode plasma activation.

FIG. 1 shows a schematic illustration of the directed vapor deposition process. Using this process, dense nickel aluminide bond coats that are desired for TBC applications have been produced. In DVD, the carrier gas stream 5 is created by a rarefied, inert gas supersonic expansion through a nozzle 30. The speed and flux of the atoms entering the chamber 4, the nozzle parameters, and the operating chamber pressure can all be varied leading to a wide range of accessible processing conditions. Critical to the process is the supersonic carrier gas stream maintained by achieving a high upstream pressure (i.e. the gas pressure prior to its entrance into the processing chamber), $P_u$, and a lower chamber pressure, $P_o$. The ratio of the upstream to downstream pressure along with the size and shape of the nozzle opening 31 controls the speed of the gas entering the chamber 4. The carrier gas molecular weight (compared to that of the vapor) and the carrier gas speed controls its effectiveness in redirecting the vapor atoms via binary collisions towards the substrate 20. As will be discussed later, alternative embodiments of the present invention process will provide the ability to evaporate from two or more individual source rods and the ability to ionize the evaporated flux using hollow cathode plasma activation.

Still referring to FIG. 1, the aforementioned DVD process is schematically shown in FIG. 1, improving the deposition efficiency, increasing the deposition rate and enhancing the coating uniformity. As will be discussed later, the hollow cathode system 58 is optional based on desired operations. In a preferred embodiment, the carrier gas 5 is realigned so that it is substantially in-line with the crucible 10. In this alignment, the carrier gas flow is placed completely or substantially around the crucible 10 so that the vapor flux 15 no longer has to be turned 90 degrees towards the substrate 20, but rather can be simply focused onto the substrate located directly above the evaporant source 25. The carrier gas 105 flows substantially parallel with the normal axis, identified as CL. Additionally, as will be discussed later herein, the nozzle 30 has a nozzle gap or opening 32, through which the carrier gas 5 flows, is designed such that a more optimal carrier gas speed distribution for focusing the vapor 15 is produced. Also shown is the electron beam gun 3 and vacuum chamber 4.

Regarding component heating, TBC's are typically applied at a very high temperature (e.g., 1050° C.). This temperature is achieved by pre-heating the blade before it is entered into the chamber. Due to the configuration of the system in the present invention, such that the blade is placed directly above the source and the carrier gas flow rate may be decreased, the amount for radiant heat from the source is greatly increased and thus blade heating using a standard pre-heating furnace may be realized.

Moreover, in the existing design of the conventional DVD system, both the vapor and carrier gas flow pass through supersonic shock waves as the gas and vapor move away from the gas flow nozzle. These shock waves affect the density and distribution of the vapor. When a coating surface is then placed such that it intersects the flow, the resulting atomic structure of growing film can be affected by the distance from the gas flow nozzle to the coating surface (relative to the shocks in the flow). In the present invention system, there will still be supersonic shock waves in the carrier gas flows emerging from the ring nozzle. However, since the vapor is no longer incorporated directly into that carrier gas flow, its distribution and density will be less affected by the shocks in the system. As a result, the present invention process will become less critically dependent upon the position of gas flow nozzle and coating surface. Thus, when the geometry of the part being coated dictates a smaller (or larger) source to substrate separation, the present invention system design will be able to more easily accommodate such parts while still producing the desired atomic structure.

Another advantage of present invention nozzle design is that it may be used with larger source sizes without the need for adding significantly more pumping capacity. The pumping capacity required for DVD is a function of the nozzle opening area. Larger openings require more pumping capacity in order to reach the same chamber pressure than smaller openings. Additionally, as the source size is increased, the nozzle opening size must be increased, and this is true for both configurations. However, the area increase for the present invention ring configuration is much less than for the conventional circular shaped opening. For example, if one assumes that increasing the source size from 0.0127 m to 0.0381 m requires a three fold increase in the nozzle diameter, the increased nozzle opening area can be calculated for both configurations. It is found that the circular opening would have a nine fold increase in area while the ring opening would have only a 2.76 fold increase. Thus, a significant savings in the required pumping capacity and gas flow costs is achieved. The benefit of increasing the source size is that the vapor emitting surface would be increased by nine fold, and in conjunction with the 3 to 4 time improvement in the deposition efficiency, could lead to a deposition rate which is more than 30 times higher than current DVD technology (i.e., greater than 500 μm/min. is then possible based on current deposition rates (of 15 to 20 μm/min.)).

Multisource Evaporation

Figure 2:
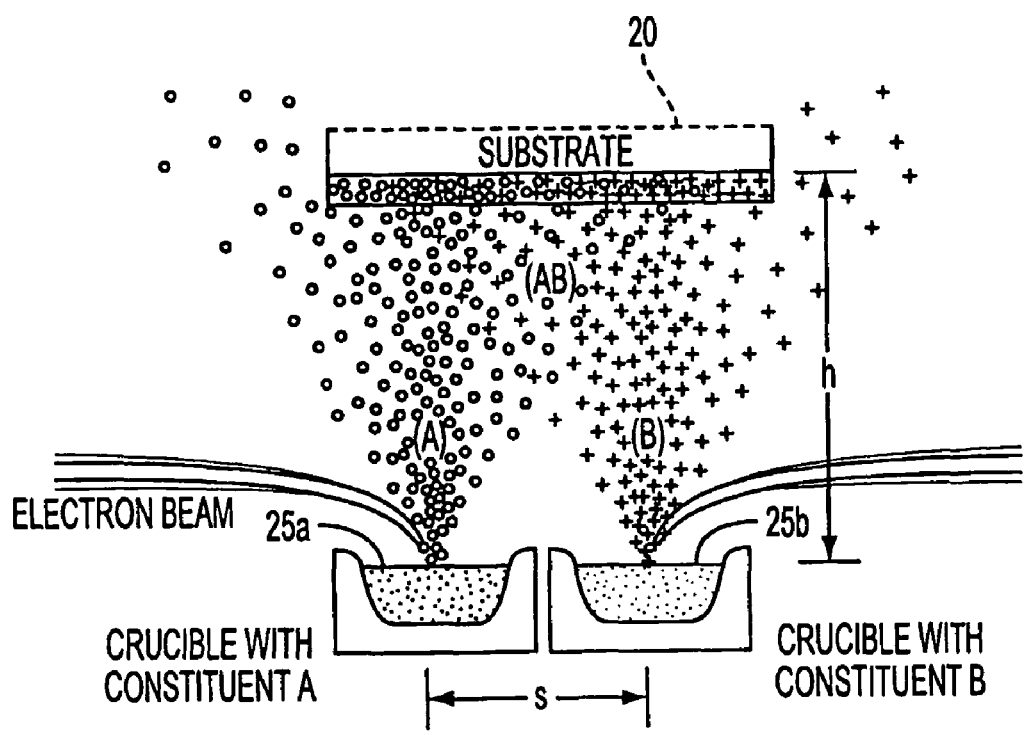
FIG. 2 is a schematic illustration showing the use of a two crucible arrangement for alloy deposition using conventional electron beam evaporation.

On the other hand, for instances where a single alloy is not applied, materials must be evaporated from two or more sources using either a single or multiple electron beam gun arrangement. As shown in FIG. 2, in a conventional EB-PVD configuration, the film composition is strongly dependent on the position of the sources and the substrate position. The compositional uniformity and region of vapor mixing can be maximized when the source spacing, s, is small and the source to substrate distance, h, is large. However, such a configuration is often not advantageous as large source to substrate distances lower the materials utilization efficiency (MUE, the ratio of evaporated atoms which deposit onto the substrate) and the use of a small source size leads to reduced evaporation rates. This is not conducive to high rate deposition and is significantly more costly than single source evaporation. Improved multisource deposition approaches are therefore desired which yield compositionally uniform vapor fluxes and a high process efficiency are therefore desired.

Figure 3:
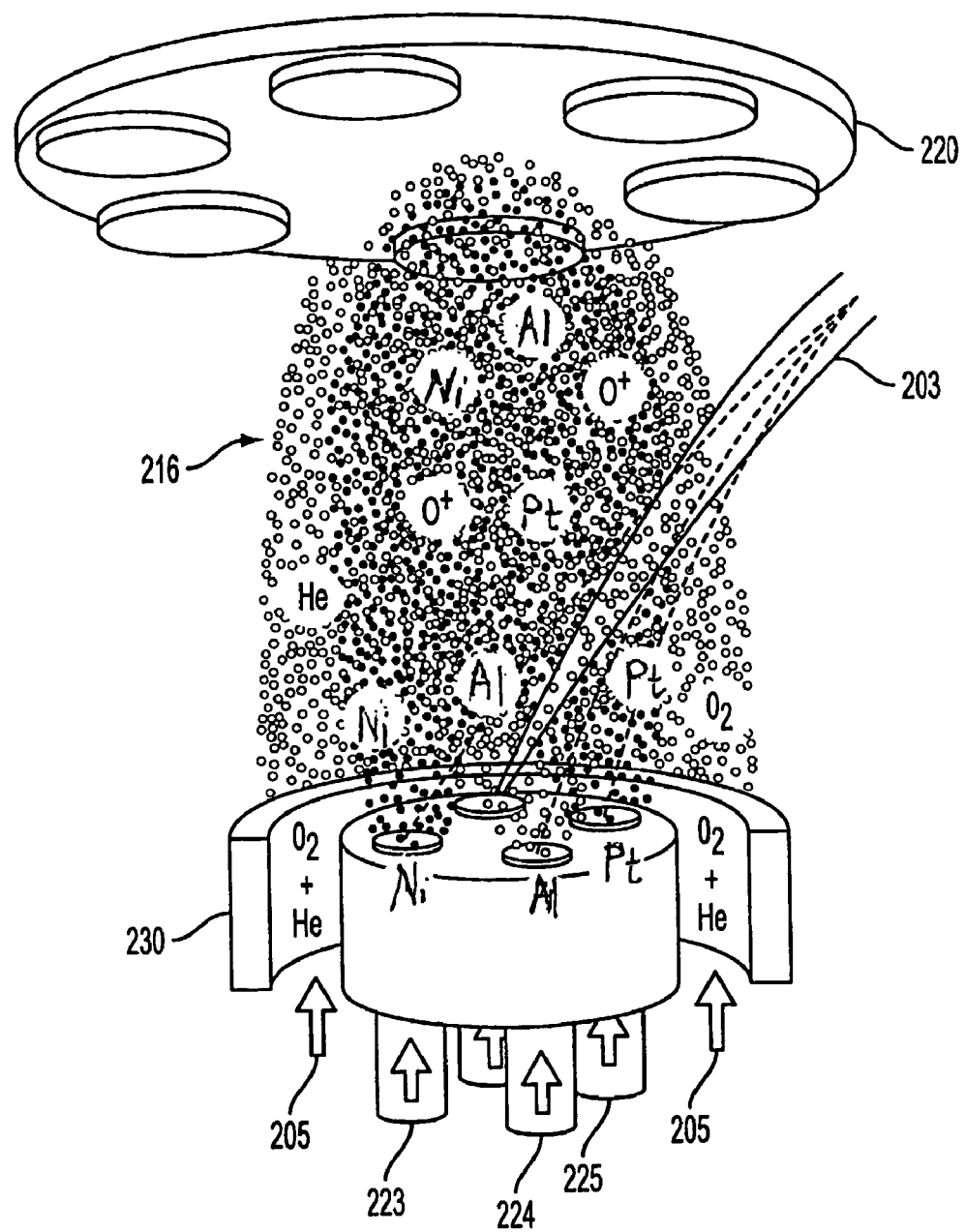
FIG. 3 is a schematic illustration of the present invention showing the use of multiple source evaporation in directed vapor deposition. For example, using a 100 kHz scan rate, a single e-beam can be scanned across multiple, closely-spaced vapor sources for precise alloy or multilayer deposition. The water-cooled copper crucible and independent source feed motors make possible independent material feed and evaporation. The setup is shown schematically for Ni/Al/Pt evaporation.

As another aspect of the present invention, as illustrated in FIG. 3, there is provided an alternative embodiment, wherein vapor phase mixing can be achieved by aligning two (or potentially more) sources 223, 224, 225 in line with a carrier gas flow 205 and using electron beam scanning 203 to uniformly heat both (or plurality of) sources. The use of the carrier gas jet in this embodiment not only scatters the vapor flux toward the substrate, leading to a potentially high MUE (and high deposition rates), but also randomizes the vapor trajectory facilitating vapor phase mixing of the two (or plurality of) fluxes 216. A high MUE would allow for the use of small diameter metal source materials, which could be spaced closely together to further improve the compositional uniformity of the coating, while still achieving a high rate of deposition. The composition of the deposited layer could be systematically controlled by altering the electron beam scan pattern to change the surface temperature (and thus the evaporation rate) of each source material.

Figure 4:
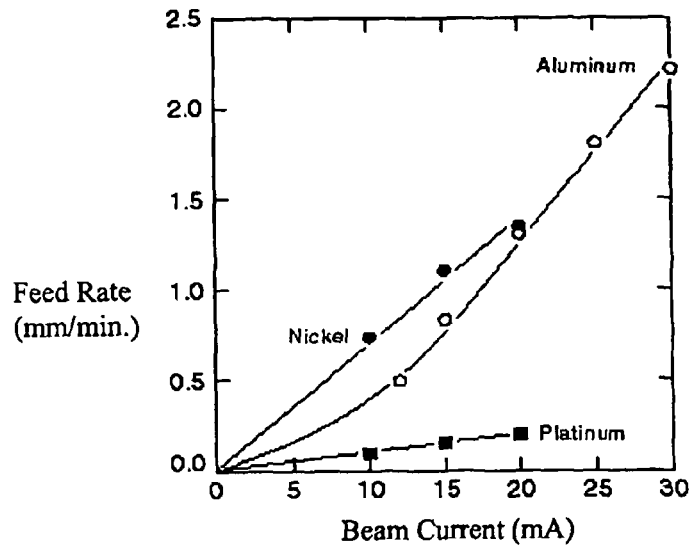
FIG. 4 is graphical illustration showing the effect of e-beam current on the source material feed rate required to maintain a constant melt pool and vapor stream.

In one preferred embodiment, the electron beam gun in the directed vapor deposition system has been equipped with a high speed e-beam scanning system (up to about 100 kHz) with a small beam spot size (<about 0.5 mm) to allow multiple crucibles to be placed in close proximity to one another for precise heating and vapor mixing, FIG. 2. The carrier gas surrounds the vapor sources and allows the vapor from the neighboring melt pools to interdiffuse. The composition of the deposited layer can then be controlled by altering the electron beam scan pattern to change the temperature (and thus the evaporation rate) of each source material. In effect this is a splitting of the beam into two or more beams with precisely controllable power densities. As a result, the present invention DVD system enables the evaporation of several materials simultaneously and thus, precise composition control in the coating can be achieved. Using a 100 kHz scan rate, a single e-beam can be scanned across multiple, closely-spaced vapor sources for precise alloy or multilayer deposition. The water-cooled copper crucible and independent source feed motors make possible independent material feed and evaporation. The setup is shown schematically for Ni/Al/Pt evaporation. A single e-beam can be scanned across multiple, closely-spaced vapor sources for precise alloy or multilayer deposition. The water-cooled copper crucible and independent source feed motors make possible independent material feed and evaporation In FIG. 4, the effect of e-beam current on the required source material feed rate for constant evaporation is graphically shown. The feed rate gives a measure of the evaporation rate. It should be noted that as the beam current is altered, the required source feed rate changes, and in turn the vapor concentration of each element in the carrier gas. The evaporation rate of each source is independent of those for the other sources. The result of altering the beam current is graphically shown in FIG. 4 where coatings of vastly different composition have been produced by incorporating different power density levels to each source.

Figure 5:
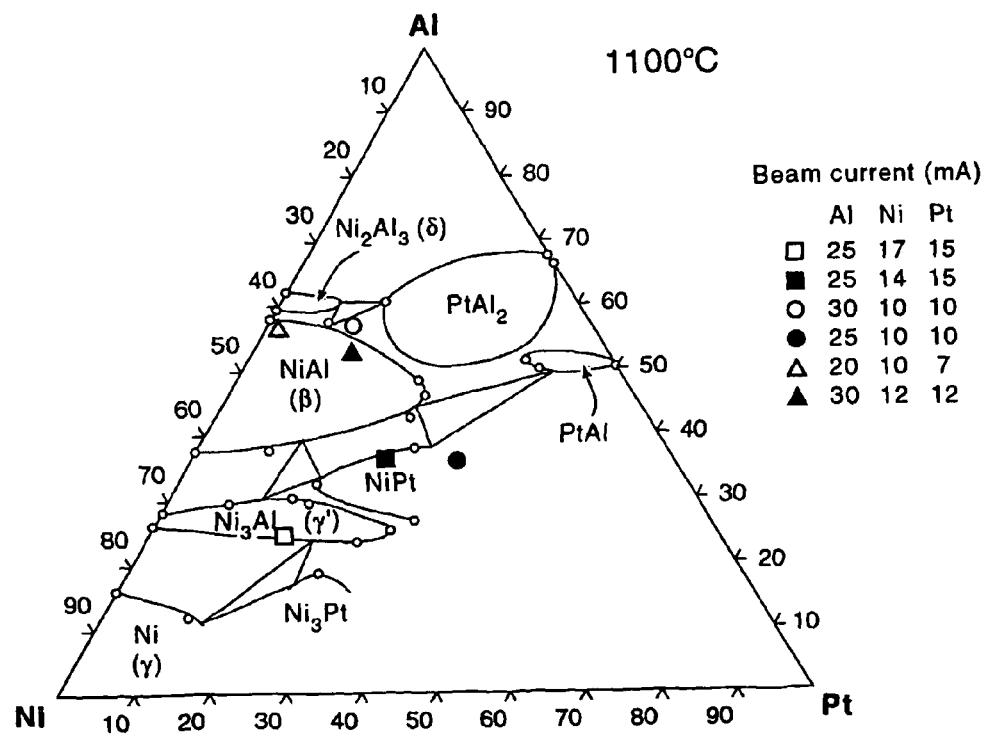
FIG. 5 is a graphical illustration demonstrating that by altering the e-beam current levels the coating composition can be altered. Shown is a Ni/Al/Pt ternary phase diagram showing the EDS measured compositions of coatings deposited using different beam current combinations.

As graphically illustrated in FIG. 5, by altering the e-beam current levels the coating composition can be altered. Shown is a Ni/Al/Pt ternary phase diagram showing the EDS measured compositions of coating deposited using different beam current combinations.

Figure 6A:
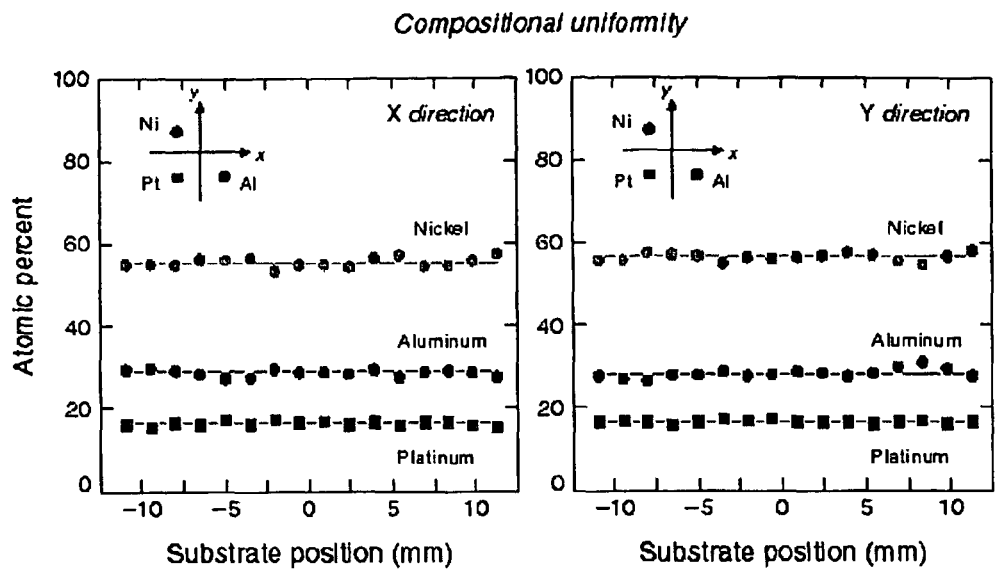
FIGS. 6A-6B are graphical illustrations showing the through-thickness uniformity of a Ni/Al/Pt layer deposited using the present DVD approach. It can be noted that the uniform composition along the entire cross-section of the coating and the sharp substrate/bond coat interface.
Figure 6B:
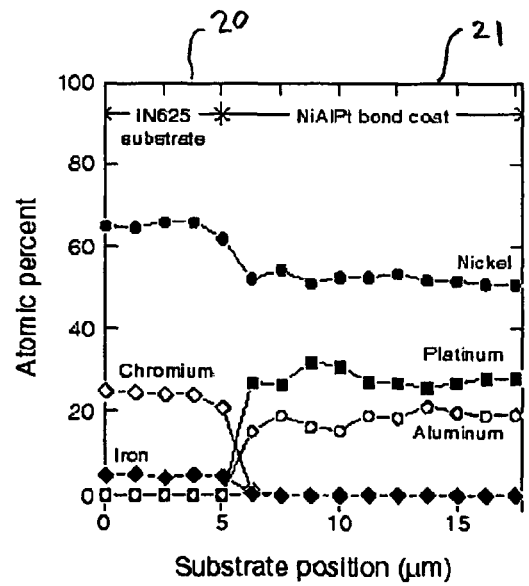

Also of critical importance in some embodiments is the ability to maintain a uniform composition across the desired coating area. In FIG. 6A, the composition of a Ni—Al—Pt coating is shown in the x and y direction across the substrate. It should be noted that the coating composition does not vary greatly across the entire 2.54 cm×2.54 cm substrate. In addition, compositional uniformity in the through-thickness direction is also desired as inter-diffusion between the substrate and the bond coat can lead to the formation of nonprotective oxide layers, thus promoting TBC failure. In FIG. 6B the through-thickness composition of a Ni/Al/Pt coating is schematically illustrated. The process provides a uniform composition throughout the bond coat and a sharp interface between the substrate and the bond coat displaying limited interdiffusion during processing. The uniform composition is provided along the entire cross section of the coating.

Plasma Enhancement

In an alternative embodiment, to endow the DVD process with the ability to create dense, crystalline coatings, a plasma activation unit is incorporated into the DVD system. As will be discussed in greater detail below, plasma-activation in DVD is performed by a hollow-cathode plasma unit capable of producing a high-density plasma in the system's gas and vapor stream, See FIGS. 7-12. The particular hollow cathode arc plasma technology used in DVD is able to ionize a large percentage of all gas and vapor species in the mixed stream flowing towards the coating surface. This ionization percentage in a low vacuum environment is unique to the DVD system. The plasma generates ions which can be accelerated towards the coating surface by either a self-bias or by an applied electrical potential. Increasing the velocity (and thus the kinetic energy) of ion by using an applied potential allows the energy of depositing atoms to be varied, affecting the atomic structure of coatings. The DVD) process has the ability to combine focused evaporation with plasma activation for rapid, efficient deposition of various crystal structures. The plasma device emits low energy electrons which ionize the vapor atoms and carrier gas. By properly biasing the substrate the impact energy the both species can be controlled.

The effect of plasma activation on the morphology of NiAl coatings is shown in SEM micrographs representations of FIGS. 13A-13B, wherein two nickel aluminide coatings are shown using identical DVD process conditions. In the first case, as shown in FIG. 13A, no plasma activation was used and in the second case, as shown in FIG. 13B, plasma activation using a plasma current of 120 A and a −75 V substrate bias was employed. When no plasma activation was used, a columnar coating resulted which is not expected to be useful for the TBC bond coat application. However, when plasma activation is used, the columnar pores are removed and a NiAl layer with the proper bond coat morphology results, and thus a denser NiAl coating results. Other levels of plasma current and substrate bias may be utilized as desired.

Figure 7:
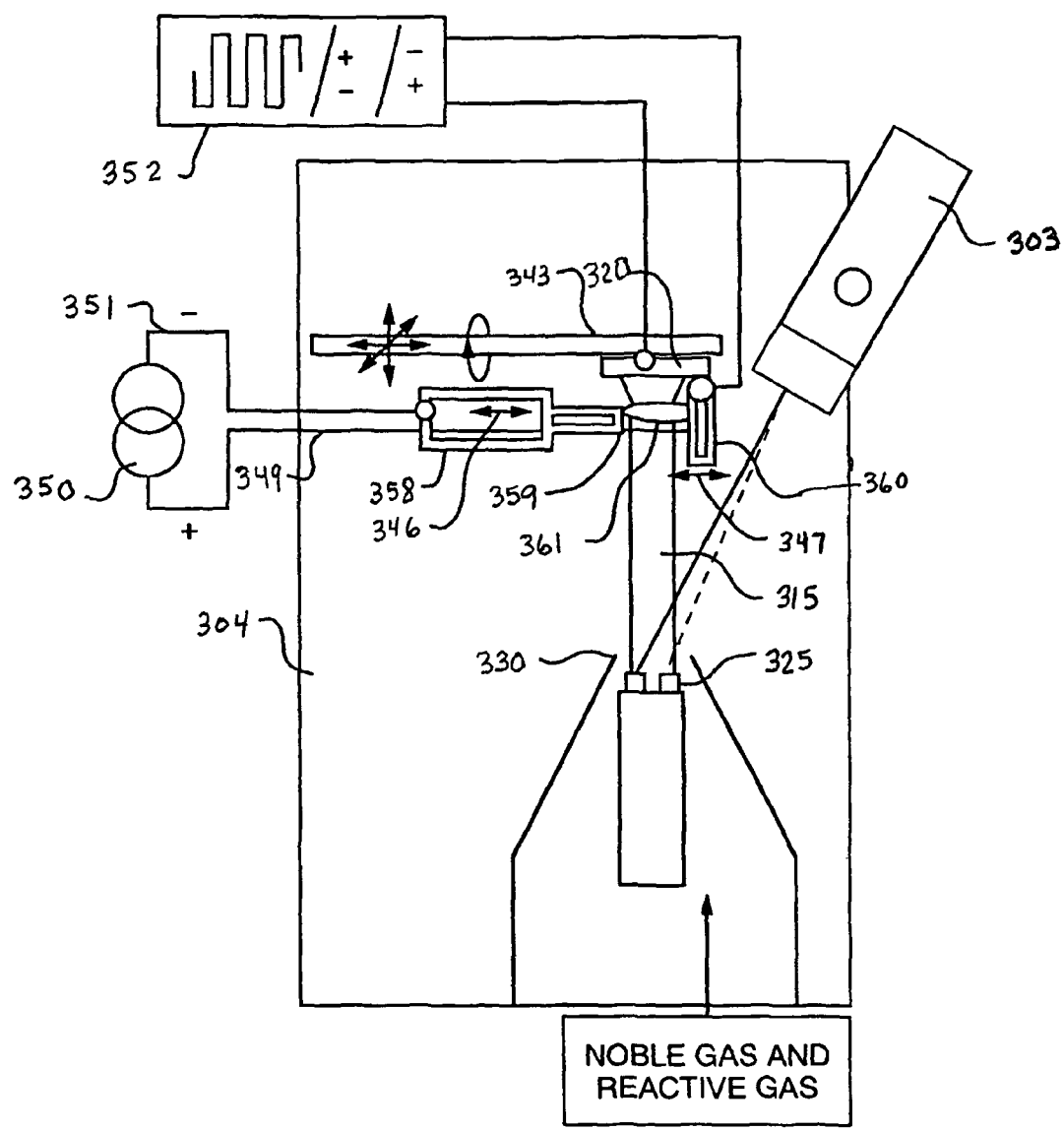
FIG. 7 is a schematic illustration of the hollow cathode plasma activation unit, optionally, used in the present invention DVD apparatus. The cathode plasma activation device emits low energy electrons that ionize the vapor atoms and carrier gas. By properly biasing the substrate the impact energy of both species can be controlled.

Turning to FIG. 7, the major components of the present invention DVD system including a hollow cathode arc plasma activation and substrate bias supply as schematically shown. The present invention DVD system is comprises a vacuum chamber 304, a rod feed evaporator 325 that is placed which is heated up to evaporation temperature of evaporant by the electron-beam of an electron gun 303 and provides the vapor for coating of substrates 320. Vaporized evaporant is entrained in the supersonic gas and vapor stream 315 formed by the nozzle 330. The substrate(s) 320 are fixed at a substrate holder 343 which enables shift of the substrate in any independent direction and to be swiveled. For example, the translation motion in the horizontal plan allows the exposed surface areas of the substrate to the vapor stream for defined dwelling times and control of the local coating thickness. The vertical motion can be used to keep constant the distance between plasma and surface for curved substrates. Swivel motion, in coordination with the translation motions, can be used to enable the coating of complete three-dimensional parts or can be used also to change the incidence angle of the vapor particles in the course of layer coating in a defined way for getting distinct layer properties. The hollow cathode (arc source) 358 is placed laterally below substrate holder 343 with a short distance between the cathode orifice 359 and the gas and vapor stream 315. The anode 360 is arranged opposite the cathode orifice 359 (i.e., on an approximate distant side of the stream 315) so that the fast electrons and the plasma discharge 361 crosses the gas and vapor stream 315. The fixtures for the cathode 346 and for the anode 347 provides the ability to adjust the distance of the cathode 358 and the anode 360, thereby influencing the diameter and the shape of gas and vapor stream 315.

The plasma discharge 361 is in close proximity (arranged with short distance) to the surface of the substrate 320 enabling close contact between dense plasma and the substrate surface to be coated. In the vicinity of the evaporation electron-beam from the electron gun 303, the anode power line 349 from the power generator 350 to the anode 360 is arranged closely and in parallel with both the plasma discharge 59 and the cathode power line 351, which runs from the cathode to the power generator 350. Between the substrate 320 and the anode 360, a bias generator 352 is applied that allows for generation of a positive, a negative or a periodically alternating voltage between the substrate 320 and the plasma 361.

Figure 8A:
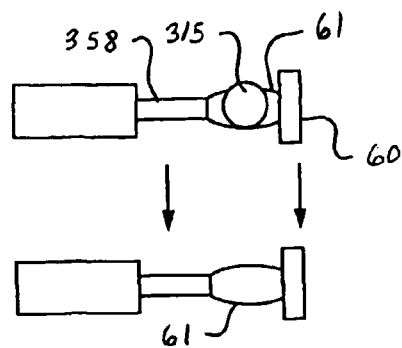
FIGS. 8A-9B show a schematic top view of select components of FIG. 7, wherein the anode and/or cathode change positions or directions thereby affecting operation.
Figure 8B:
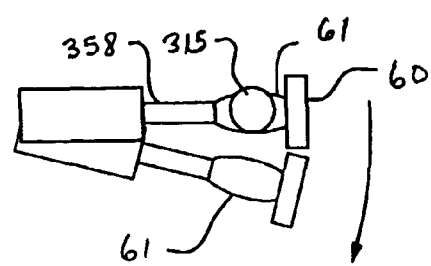

Turning to FIGS. 8A-8B, FIG. 8A demonstrates the horizontal shift of the cathode 358 and anode 360 from an initial position to a secondary position, while still maintaining the plasma discharge. FIG. 8B demonstrates the horizontal turn of the cathode 358 and anode 360 arrangement away from the vapor-gas-jet 361, while still maintaining the plasma discharge.

Figure 9A:
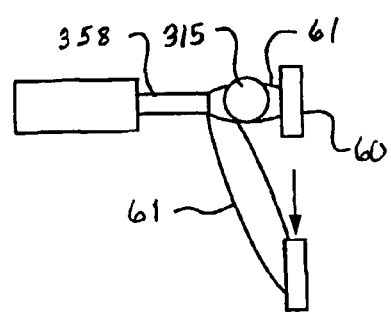
Figure 9B:
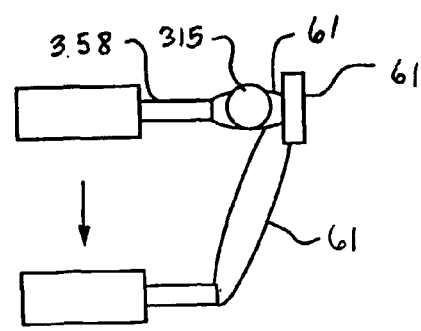

Next, turning to FIGS. 9A-9B, FIG. 9A demonstrates the displacement of the plasma discharge 361 away from the gas and vapor stream 315 by moving sideward (i.e., horizontally) the anode 360 only. Similarly, FIG. 9B demonstrates the displacement of the plasma discharge 361 away from the gas and vapor stream 315 by moving only the cathode 358 sideward.

Figure 10:
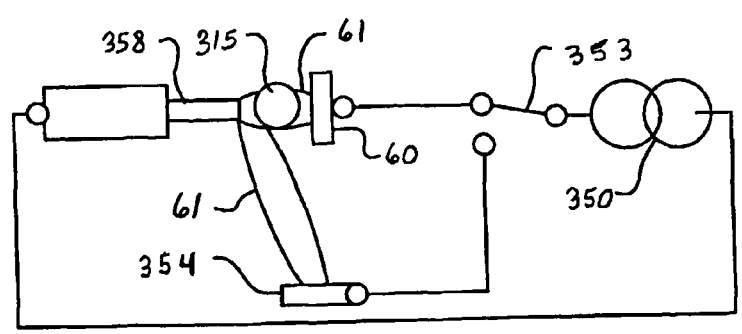
FIG. 10 shows a schematic top view of select components of FIG. 7, wherein the anode is replaced with an auxiliary anode thereby affecting operation.

Moreover, FIG. 10 demonstrates the displacement of the plasma discharge 361 away from the gas and vapor stream 315 by switching the power supply 350 with the switch 353 from the active anode 360 to an auxiliary anode 354.

Figure 11:
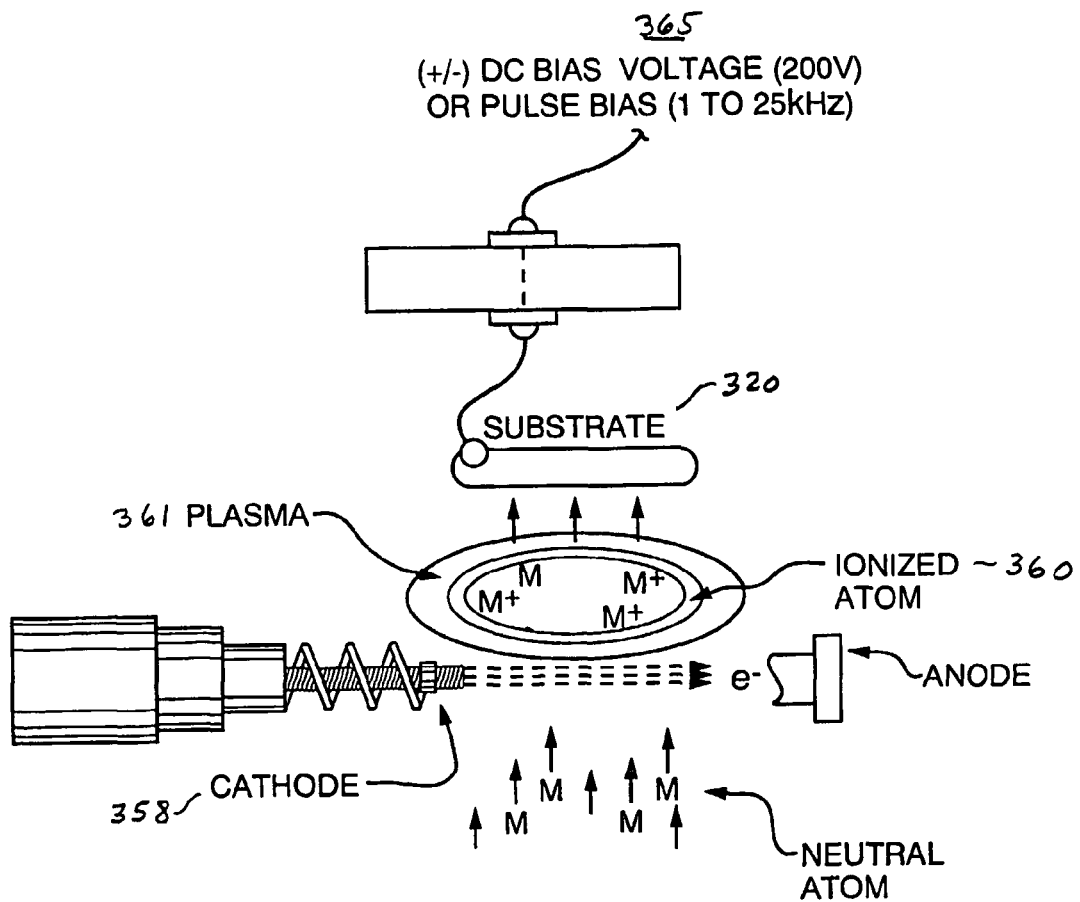
FIG. 11 provides an enlarged partial view of the embodiment shown in FIG. 7.

FIG. 11 provides an enlarged partial view of the embodiment shown in FIG. 7.

Turning to FIG. 12, FIG. 12 schematically illustrates an alternative embodiment wherein the instant system and method has the main gas and vapor stream 315 which is deflected from the vertical direction 371 by interaction with the working gas flow 372 of the hollow cathode 358 escaping from the cathode orifice 359 resulting in a bending of the vapor stream 375 away from the cathode side. The directed gas injection 373 is in an opposed position to the cathode through a gas channel 370 integrated in the anode block 10 and enables the compensation of deflection. Therefore, the resulting gas and vapor stream 374 flows in the vertical direction again. Overcompensation will result in a bending of the main gas and vapor stream 376 towards the cathode side. The same channel 370 can be used for clear gas influx to keep free the anode or parts of the anode surface from insulating contamination. This clear gas influx feature can been done independently or in combination with the bending effect injection of the anode.

Other means for creating a plasma made up of the ionized evaporant and/or carrier gas atoms can be utilized including the use of microwave or other radio frequency discharges. Once created, plasma enhanced deposition is possible under the action of a self bias or one applied externally to the substrate. The applied bias can be static (DC) or oscillated (RF) or pulsed.

Additional Bond Coat Embodiments

The present invention DVD process allows for the creation of novel bondcoat concepts. Some example embodiments include, but not limited thereto 1) multilayered NiAl/Alumina composites, and 2) nanoparticle NiAl/alumina composites. Both of these embodiments increase the strength of the bond coat which in turn leads to increased TBC system lifetimes.

The multilayer composites embodiment is produced by co-evaporation of Ni and Al in a plasma environment. At various times during the deposition, the Ni evaporation is stopped and oxygen is fed into the carrier gas stream resulting in the deposition of alpha alumina. By repeating this process, multilayer coatings of NiAl and alumina are created. Such structures will further improve TBC performance as reduced diffusion in the alumina layers will prevent the migration of elements in the substrate to the top of the bond coat where they can promote nonprotective oxide growth. Other layers which reduce substrate/bond coat interdiffusion may also be added.

The NiAl/alumina nanoparticle composites embodiment is produced by codeposition of NiAl and alumina nanoclusters. The nano clusters are grown in a separate higher pressure region and then injected at high velocity into the DVD chamber using a choked nozzle. These nanoclusters impinge on the substrate embedding themselves into the depositing layer and are subsequently buried by further NiAl deposition The DVD crucible design enables the simultaneous evaporation of four material sources. In addition, it is possible to deposit coatings with more than four elements by using alloy source rods as the starting sources for evaporation. This would enable the addition of rare earth solid solution strengtheners in depositing novel multi-element bond coats.

Multiple Blade Coating

Another aspect of the present invention method and system, is directed at the capability to "steer" vapor flux from the nozzle by changing the pressure in the nozzle on either side of the vapor source.

Figure 14:
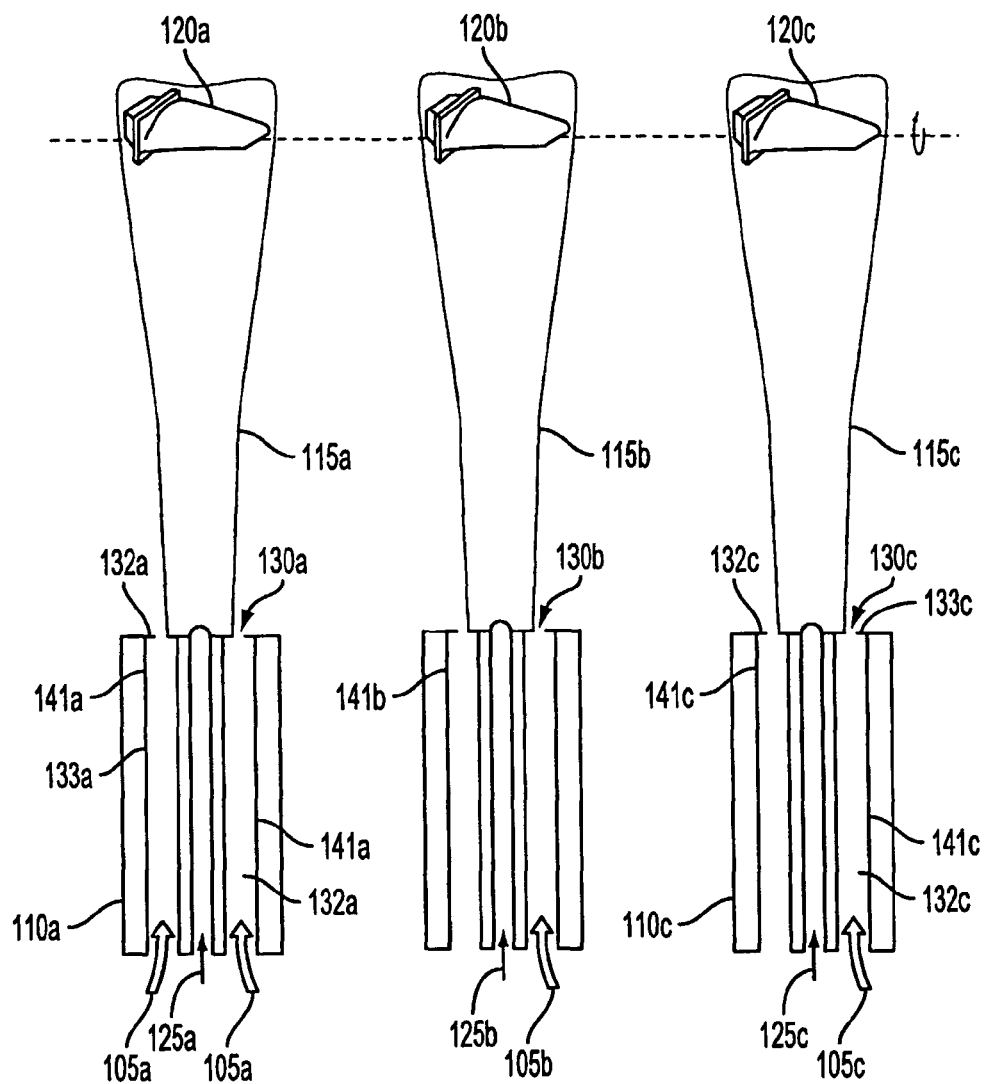
FIG. 14 is a schematic illustration showing a multiple crucible and multiple jet arrangement, in which each source is heated with an electron beam (using either beam scanning or multiple e-beam guns) and the vapor is directed onto a turbine blade or blades at high efficiency and rate.

Still further, another aspect of the present invention, as shown in FIG. 14, is directed at coating several blades at one time. It is often desirable to coat several blades at one time within the deposition chamber. This embodiment allows for using a number of sources (125(*a*), 125(*b*), 125(*c*)), carrier gas streams (105(*a*), 105(*b*), 105(*c*)), and nozzles (130(*a*), 130(*b*), 130(*c*)) to focus vapor onto individual components. FIG. 14 is a schematic illustration showing a multiple crucible/jet arrangement. In a preferred embodiment, the nozzles include nozzle gaps 132(*a*), 132(*b*), 132(*c*) where carrier gas streams flow therefrom. The nozzle gaps are non-angular 141(*a*), 141(*b*), 141(*c*) having a ring-shape 133(*a*), 133(*b*), 133(*c*). Each source is heated with an electron beam (using either single beam scanning gun or multiple e-beam guns) and the vapor is directed onto a turbine blade at high efficiency and rate. In this case shown, the vapor flux distribution (115(*a*), 115(*b*), 115(*c*)), is adjusted to the size of the blade or target (120(*a*), 120(*b*), 120(*c*)). This allows multiple blades or targets to be simultaneously coated at high rate to result in a very high process throughput. Steering of the vapor is accomplished using non-angular symmetric nozzles. In one approach, an additional electron beam 103 is employed for each source 105. A preferred method is to use the high frequency scanning capability of the electron beam to maintain evaporation from many sources simultaneously.

Figure 15:
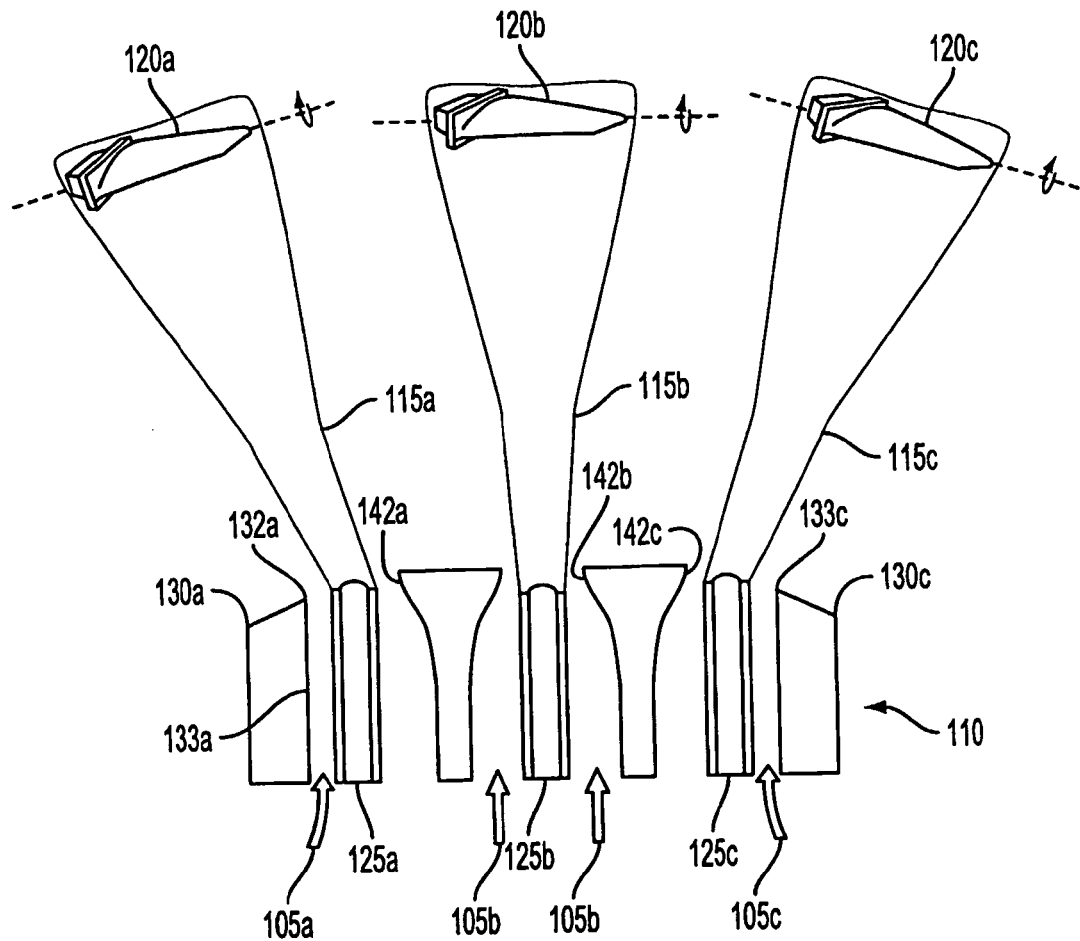
FIG. 15 is a schematic illustration showing a multiple nozzle per crucible configuration in which nozzles can be closely spaced so that one electron beam can be scanned across each source for simultaneous heating, and the orientation of the nozzle openings can be altered to steer the flux onto widely spaced components.

Turning to FIG. 15, an additional aspect of the present invention allows for steering of the vapor using angular symmetric nozzles defined by angular channels 142(*a*), 142(*b*), 142(*c*). In this configuration, multiple sources 125(*a*), 125(*b*), 125(*c*), carrier gas streams 105(*a*), 105(*b*), 105(*c*), and nozzles 130(*a*), 130(*b*), 130(*c*) are employed to steer the vapor flux onto widely spaced individual components. The schematic illustration of this embodiment shows a multiple nozzle per crucible configuration in which nozzles are closely spaced so that one electron beam can be scanned across each source for simultaneous heating. The orientation of the nozzle openings are altered to steer the flux onto widely spaced components (e.g., targets/substrate).

Figure 16:
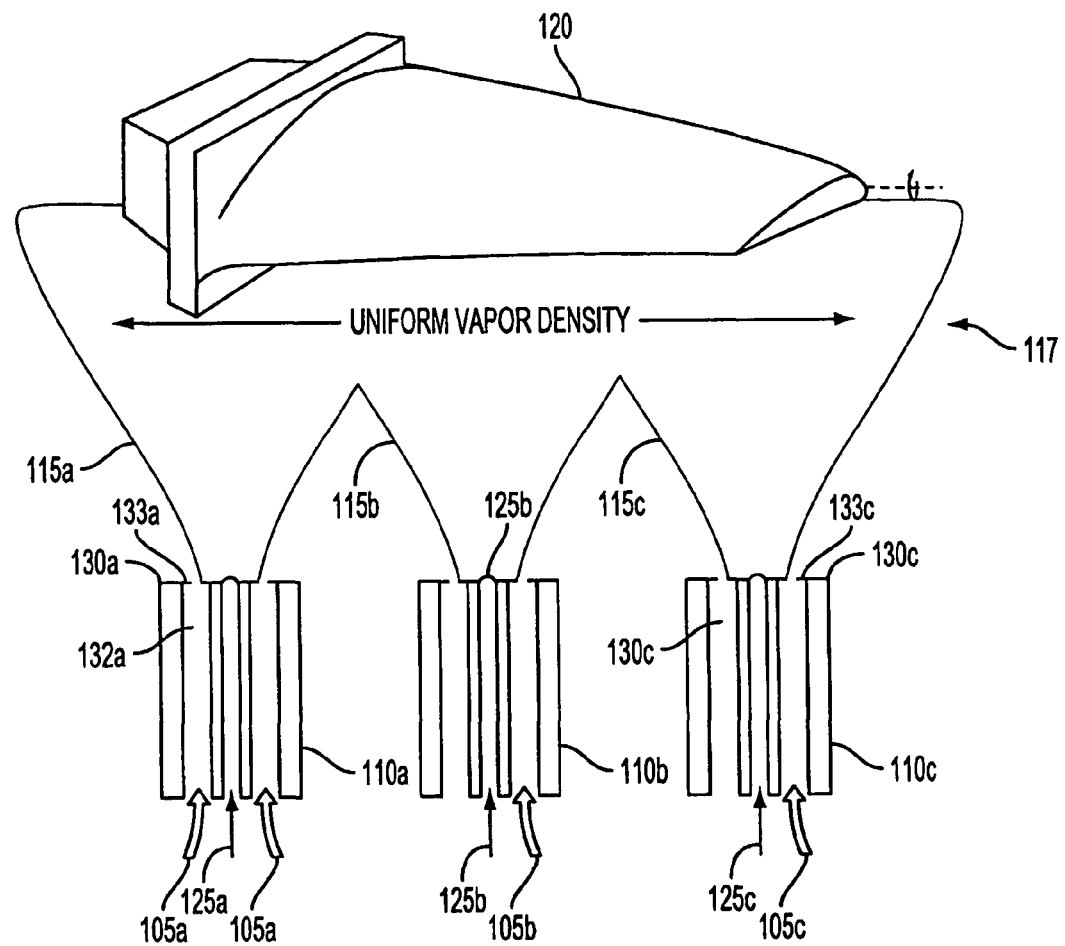
FIG. 16 is a schematic illustration of the use of multiple sources to moderately focus a vapor flux, which results in a large uniform vapor flux distribution and allows for the uniform coating of large turbine blades such as those used in industrial power generation turbines.
Figure 17:
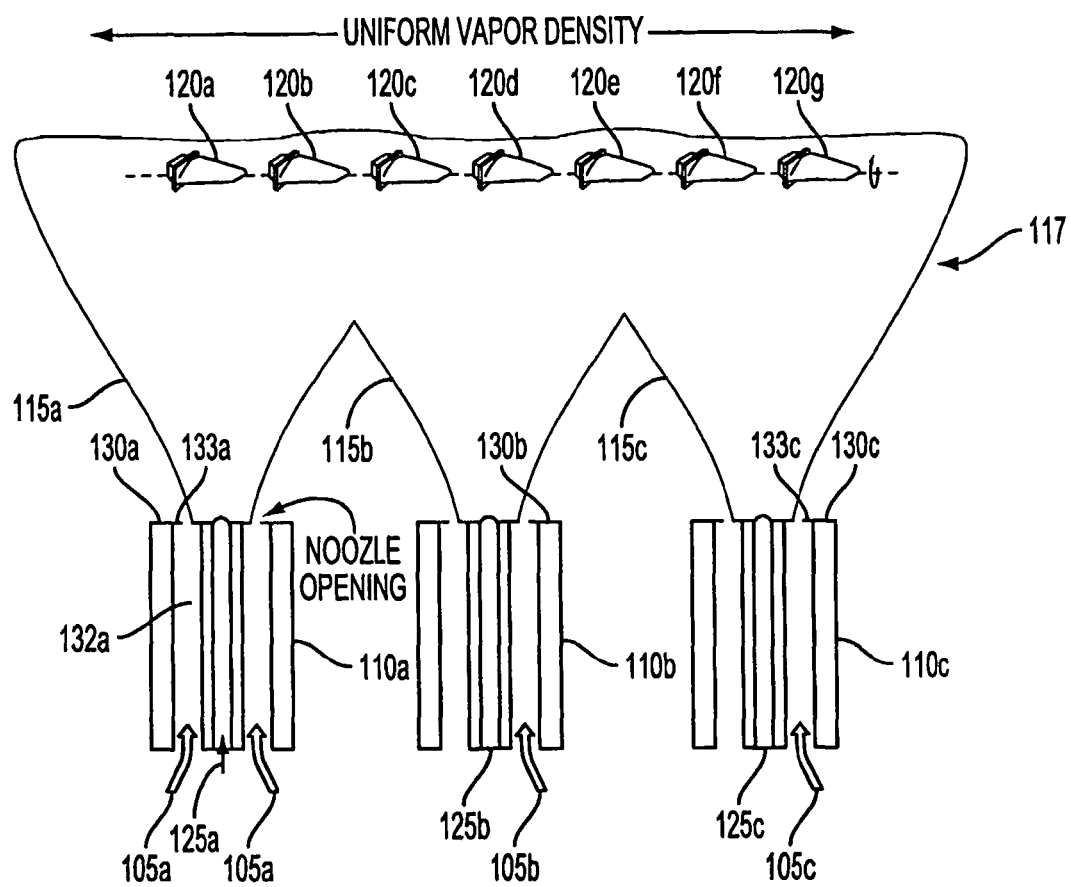
FIG. 17 is a schematic illustration showing the use of a multiple crucible/jet arrangement in which a vapor flux is focused to result in a large uniform vapor flux distribution such that a large number of small turbine blades can be placed into the vapor and be uniformly coated at moderately high efficiency and rate.

Turning to FIGS. 16 and 17, in a eighth aspect of the present invention, multiple sources (125(*a*), 125(*b*), 125(*c*)), carrier gas streams (105(*a*), 105(*b*), 105(*c*)), and nozzles (130(*a*), 130(*b*), 130(*c*)) to create one large, uniform vapor cloud in which blades can be placed. Referring to FIG. 16, this embodiment uses multiple sources to moderately focus a vapor flux, which results in a large uniform vapor flux distribution 117 and allows for the uniform coating of large turbine blades such as those used in industrial power generation turbines.

Turning to FIG. 17, this embodiment uses multiple crucibles and jets arrangement in which a vapor flux is focused to result in a large uniform vapor flux distribution 117 such that a large number of small turbine blades can be placed into the vapor and be uniformly coated at moderately high efficiency and rate. An advantage of this approach is that less carrier gas flow is required while more blades per coating cycle may be coated. The proper approach is dependent on the size of the blades being coated. This approach may be appropriate when blades which are much smaller or larger than the uniform area of a individual jet.

Figure 18A:
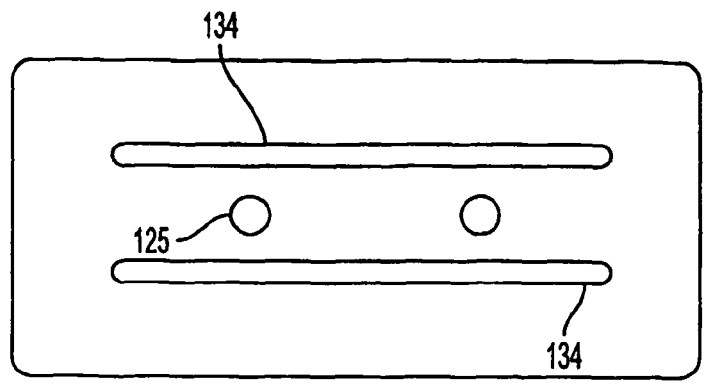
FIGS. 18(A)-18(C) is a schematic illustration showing a nozzle configuration consisting of elliptical nozzles, in which the elongated nozzle openings (gaps or channels) are used to focus the vapor flux along one direction, which results in an elliptical vapor flux distribution.
Figure 18B:
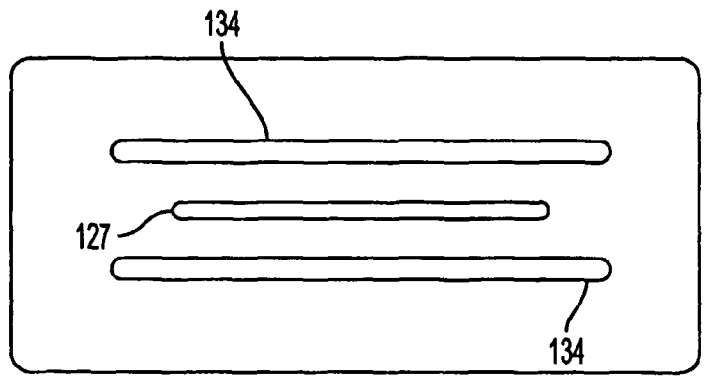
Figure 18C:
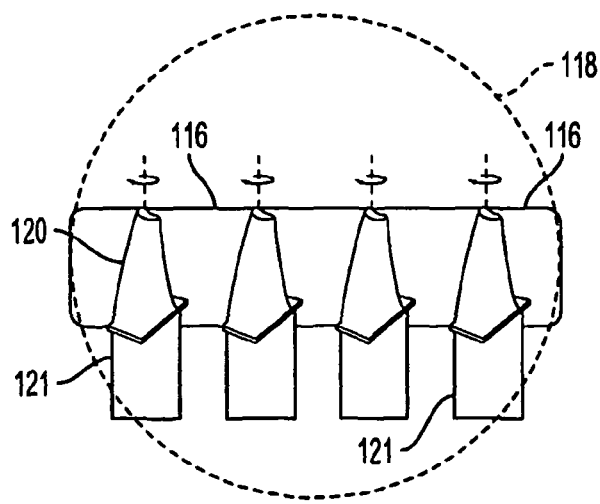

As discussed above, it is also recognized that nozzle shapes other than ring-shaped may be useful. As shown in FIGS. 18(A)-18(C), in another aspect of the present invention, alternative embodiments utilize elongated elliptical ring gaps 134 and, optionally elongated elliptical source openings 127, to produce an elliptical vapor flux 116 distribution. This is of interest for non-circular shaped substrates such as turbine blades 120, in which a higher deposition efficiency can be realized if the shape of the vapor flux distribution is tailored to the size and shape of the part to be coated. This approach allows for one to not only apply a coating to the desired area of the part, but also to prevent coating on an area that requires subsequent part manipulation tooling or locations 121 on the part which do not require a turbine blade. The dashed lines shown in FIG. 18(C) indicate a circular vapor flux compared to the desirable elliptical vapor flux 116 distribution of the present invention. The circular case would result in a larger portion of the vapor not being utilized.

Figure 19A:
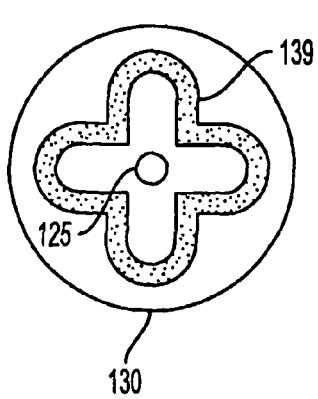
FIGS. 19(A)-19(E) are schematic illustrations showing alternate embodiment of the nozzle ring gaps and source having various shapes and respective alignment.

As an tenth aspect of the present invention and as referred to above, the nozzle gaps and source shapes may be of a variety of shapes, alignments, and quantity. For example, FIG. 19(A) schematically shows the plan view of a cross-hatch-shaped nozzle gap 139 in relation to the nozzle 130 and source 125.

Figure 19B:
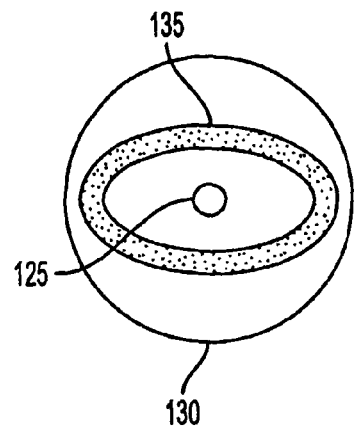

Next, FIG. 19(B) schematically shows the plan view of an elliptical-shaped nozzle gap 135 in relation to the nozzle 130 and source 125.

Figure 19C:
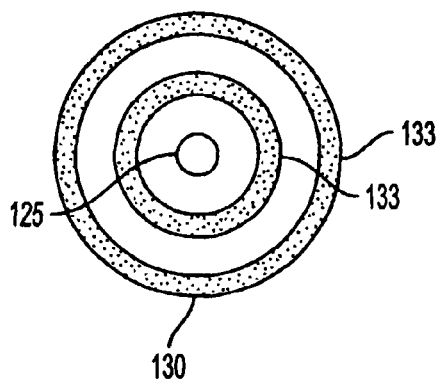

Next, FIG. 19(C) schematically shows the plan view wherein the ring-shaped nozzle gaps 133 (at least two or more) are concentric or substantially concentric.

Figure 19E:
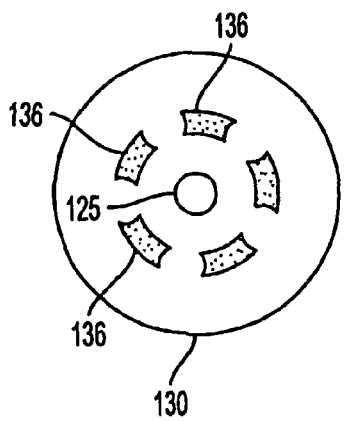
Figure 19D:
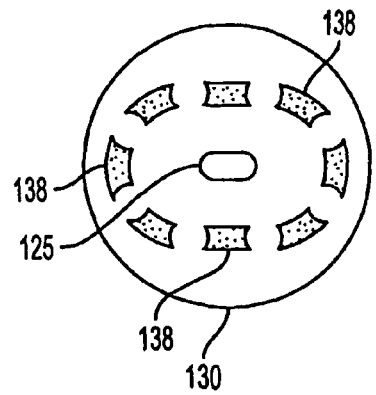

Moreover, as shown in FIGS. 19(D) and 19(E), the ring gaps or channels may be partitioned so that a plurality of segments comprise the overall gap or channel. FIGS. 19(D) and 19(E) schematically show the plan view of a segmented elliptical 138 and segmented ring gap 136.

In conclusion, the present invention describes a series of steps, and an apparatus for use therewith for applying a bond coating to a substrate of a thermal barrier coating system using an electron beam directed vapor deposition technique.

Some advantages of the present invention process and apparatus, but not limited thereto is that it provides for the materials utilization efficiency of the process to be improved, deposition rate increased, coating uniformity improved, multiple blade coating during each coating cycle, carrier gas flow costs optimized, and blades to be heated to the desired temperature.

Moreover, this invention allows the ratio of carrier gas flow to vapor molecular concentration to be dramatically reduced while increasing the material utilization efficiency of the technology. Accordingly, this breakthrough has significant positive economic implications for the utility of the process.

In addition, the present invention provides the use of an electron beam directed vapor deposition (DVD) approach wherein the vaporized material is entrained in the carrier gas jet and deposited onto the substrate at high rate and with a high materials utilization efficiency. By employing plasma enhancement, multisource crucibles and process condition control, the morphology, composition and grain size of deposited layers are controlled. The result is a low cost deposition approach for applying bond coats which have compositions which are difficult to deposit using other approaches.

The invention may be embodied in other specific forms without departing from the spirit or essential characteristics thereof. The foregoing embodiments are therefore to be considered in all respects illustrative rather than limiting of the invention described herein. Scope of the invention is thus indicated by the appended claims rather than by the foregoing description, and all changes which come within the meaning and range of equivalency of the claims are therefore intended to be embraced herein.

We claim:

1. A method for forming a thermal barrier coating system, the method comprising the steps of:
   presenting at least one substrate to a chamber;
   forming a bond coat on at least a portion of at least one said substrate by:
   presenting at least one evaporant source to said chamber,
   presenting at least one carrier gas stream to said chamber,
   impinging said at least one evaporant source with at least one electron beam in said chamber to generate an evaporated vapor flux in a main direction toward said substrate, and
   entraining said at least one generated evaporated vapor flux by said at least one carrier gas stream, wherein said carrier gas stream is essentially parallel to said main direction and substantially surrounds said evaporated flux, wherein said evaporated vapor flux at least partially coats at least one said substrate to form said bond coat; and
   depositing a thermal-insulating layer on said bond coat.

2. The method of claim 1, further comprising:
   heat treating said substrate for accommodating the formation of said bond coat.

3. The method of claim 2, wherein heat treating said substrate comprises heating at a temperature range between about 800° C. to about 1500° C.

4. The method of claim 1, wherein said presenting of at least one of said substrate includes presenting said substrate to a chamber having an operating pressure ranging from about 0.1 to about 32,350 Pa.

5. The method of claim 1, further comprising:
   said chamber further includes a substrate bias system capable of applying a DC or alternating potential to at least one of said substrates;
   impinging said at least one of said generated vapor flux and at least one of said carrier gas stream with a working gas generated by at least one hollow cathode arc plasma activation source to ionize said at least one of said generated vapor flux and at least one of said carrier gas stream; and attracting said ionized generated vapor flux and said carrier gas stream to a substrate surface by allowing a self-bias of said ionized gas and vapor stream or said DC or alternating potential to pull the ionized stream to said substrate.

6. The method of claim 5, said generated electrons from said hollow cathode arc plasma activation source is regulated for direction through variations in the quantity of working gas passing through said hollow cathode source.

7. The method of claim 5, wherein the distance between said hollow cathode arc plasma activation source and said generated evaporated vapor flux is regulated for ionization of the entire generated evaporated vapor flux.

8. The method of claim 1, further comprising at least one nozzle, wherein said at least one carrier gas stream is generated from said at least one nozzle and said at least one evaporant source is disposed in said at least one nozzle, wherein said at least one said nozzle comprises:

at least one nozzle gap wherein said at least one said carrier gas flows there from; and at least one evaporant retainer for retaining at least one said evaporant source, said evaporant retainer being at least substantially surrounded by at least one said nozzle gap.

9. The method of claim 8, wherein said evaporant retainer is a crucible.

10. The method of claim 8, wherein at least one said nozzle gap is defined by a shape selected from the group consisting of: ring-shaped, elliptical-shaped, elongated elliptical-shaped, cross-hatch-shaped, segmented ring-shaped, segmented elliptical-shaped, and segmented elongated elliptical-shaped.

11. The method of claim 8, wherein at least one said nozzle comprises a converging/diverging nozzle.

12. The method of claim 8, further comprising:
providing a plurality of said nozzles, wherein said nozzle gaps being non-angular channels; and
providing a plurality of said electron beams, wherein individual said electron beams impinges on individual said sources to generate evaporated vapor flux to at least partially coat a plurality of said substrates, each of said substrates being coated respectively from a singular said evaporant source.

13. The method of claim 8, further comprising:
providing a plurality of said nozzles, wherein said nozzle gaps being non-angular channels; and
providing a plurality of said electron beams, wherein individual said electron beams impinges on individual said sources to generate a large evaporated vapor flux to at least partially coat a singular said substrate, said substrate being coated from said plurality of said evaporant sources.

14. The method of claim 8, further comprising:
providing a plurality of said nozzles, wherein said nozzle gaps being angular channels; and
providing a singular said electron beam, wherein said electron beam impinges on individual said sources to generate evaporated vapor flux to at least partially coat a plurality of said substrates, each of said substrates being coated respectively from a singular said evaporant source.

15. The method of claim 8, further comprising:
providing a plurality of said nozzles, wherein said nozzle gaps being angular channels; and
providing a singular said electron beam, wherein said singular electron beam impinges on individual said evaporant sources to generate a large evaporated vapor flux to at least partially coat a singular said substrate, said substrate being coated from said plurality of said evaporant sources.

16. The method of any one of claim 12, 13, 14, or 15, wherein said evaporant sources have substantially the same chemical composition relative to one another.

17. The method of claim 16, wherein at least one of said evaporant sources is a material selected from the group consisting of: NiAl, PtAl, Ni, Al, Pt, NiAlPt, and NiPt.

18. The method of claim 16, wherein at least one of said evaporant sources is made from alloys formed of one or more of a material selected from the group consisting of: NiAl, PtAl, Ni, Al, Pt, NiAlPt, and NiPt.

19. The method of any one of claim 12, 13, 14, or 15, wherein at least one of said evaporant sources have different chemical compositions relative to one another.

20. The method of claim 19, further comprising:
combining at least two of said evaporant sources after impingement but prior to reaching said substrates.

21. The method of claim 19, wherein at least one of said evaporant sources is a material selected from the group consisting of: NiAl, PtAl, Ni, Al, Pt, NiAlPt, and NiPt.

22. The method of claim 19, wherein at least one of said evaporant sources is a made from alloys formed of one or more of a material selected from the group consisting of: NiAl, PtAl, Ni, Al, Pt, NiAlPt, and NiPt.

23. The method of claim 4, further comprising the steps of:
a) interrupting the progress of producing evaporated flux for forming said bond coat; and
b) providing oxygen in said at least one carrier gas stream, thereby resulting in the deposition of alpha alumina on said at least one substrate.

24. The method of claim 23, wherein step "a" and step "b" are repeated a desired number of times.

25. The method of claim 4, further comprising the steps of:
a) providing nanoclusters under a pressure greater than said chamber pressure; and
b) injection said nanoclusters at a high velocity into the said chamber, thereby resulting in nanoclusters impinged in said bond coat.

26. The method of claim 1, wherein a radio frequency field is used to ionize the evaporated vapor flux and/or the carrier gas stream and a self and/or static or radio frequency bias voltage applied to the substrate is used to provide plasma enhanced deposition of the bond coat.

27. The method of claim 1, further comprising:
a method for creating a plasma including partially or fully ionized evaporant or carrier gas stream that is used in combination with a self or applied DC or RF bias voltage applied to said substrate to provide plasma enhanced deposition of a coating.

* * * * *